United States Patent [19]

Sawada et al.

[11] Patent Number: 4,672,406
[45] Date of Patent: Jun. 9, 1987

[54] SEMICONDUCTOR MEMBER AND SEMICONDUCTOR DEVICE EMPLOYING THE SAME

[75] Inventors: Yasushi Sawada; Kiichi Ueyanagi, both of Kokubunji; Yoshifumi Katayama, Tokorozawa; Yasuhiro Shiraki, Hino; Makoto Morioka, Nishitama; Takao Kuroda, Kokubunji; Tomoyoshi Mishima, Shiki, all of Japan

[73] Assignee: Hitachi, Ltd., Tokyo, Japan

[21] Appl. No.: 684,691

[22] Filed: Dec. 21, 1984

[30] Foreign Application Priority Data

Dec. 23, 1983 [JP] Japan .................................. 58-242019

[51] Int. Cl.⁴ ............................................. H01L 29/80
[52] U.S. Cl. .......................................... 357/22; 357/16
[58] Field of Search ........... 357/16, 22, 22 MD, 22 P, 357/22 E, 23.2, 23.12, 17, 22 A, 45 L, 22 C

[56] References Cited

U.S. PATENT DOCUMENTS

| 4,194,935 | 3/1980 | Dingle et al. | 357/22 A X |
| 4,439,782 | 3/1984 | Holonyak, Jr. | 357/17 OR |
| 4,550,331 | 10/1985 | Milano | 357/16 X |

FOREIGN PATENT DOCUMENTS 0051271 5/1982 European Pat. Off. .
0091831 10/1983 European Pat. Off. .

OTHER PUBLICATIONS

Mimura, T., "Why HEMT are Necessary and How They are Made", J.E.E., vol. 20, No. 200, Aug. 1983, pp. 60-62.
Pearsall, T. P., Hendel, R., O'Connor, P., Alavi, K., and Cho, A., "Selectively-Doped AlInAs/GaInAs Hetero-Structure Transistors", IEDM, 1982, pp. 801-802.
Kastalsky, A., and Luryi, S., "Novel Real-Space Hot-Electron Transfer Devices", IEEE Electron Devices Letters, vol. EDL-4, No. 9, Sep. 1983, pp. 334-336.
Thorne, R. E., Fischer, R., Su, S. L., Kopp, W., Drummond, T. J., Morkoc, H., "Performance of Inverted Structure Modulated Doped Schottky Barrier Field Effect Transistors", Japanese Journal of Applied Physics, vol. 21, No. 4, (Apr. 1982) pp. 1223-1224.

Primary Examiner—Martin H. Edlow
Assistant Examiner—Sara W. Crane
Attorney, Agent, or Firm—Antonelli, Terry & Wands

[57] ABSTRACT

A semiconductor member has a structure wherein a first semiconductor layer is held between second and third semiconductor layers which have forbidden band widths greater than a forbidden band width of the first semiconductor layer, and wherein only the second semiconductor layer which is formed on a side of the first semiconductor layer close to a substrate is doped with impurities. The semiconductor member constructs the depletion type with the first and second semiconductor layers, and the enhancement type with the first and third semiconductor layers. A semiconductor device can be properly formed in the enhancement or depletion type by selectively connecting the semiconductor layers.

11 Claims, 7 Drawing Figures

SEMICONDUCTOR MEMBER AND SEMICONDUCTOR DEVICE EMPLOYING THE SAME

BACKGROUND OF THE INVENTION

1. Field of the Invention

The present invention relates to a semiconductor member and a semiconductor device employing it, and more particularly to a semiconductor member and a semiconductor device having a hetero-structure.

2. Description of the Prior Art

Prior-art field effect transistors employing heterostructures have basically had energy band structures shown in FIGS. 1 and 2 or these structures in which the positions of two semiconductor layers (11) and (12) are replaced with each other. As the thicknesses of the respective layers, in general, the semiconductor layer (11) of small forbidden band width is set at approximately 0.5–1.0 μm, and the semiconductor layer (12) of great forbidden band width at 0.05–0.1 μm. The device of FIG. 1 and the device of FIG. 2 differ in that, in the former case, carriers are supplied from the semiconductor layer (12) of great forbidden band width doped in the n-type (numeral 14 designates donor atoms), whereas in the latter case, they are supplied from a source electrode. In both the cases, however, the carriers (15) are confined in a triangular potential which appears on the side of a hetero-interface closer to the semiconductor layer (11) of small forbidden band width, and they are caused to travel to the semiconductor layer (11) which is a layer of high purity. Thus, the carriers which are hardly susceptible to scattering attributed to donor impurity ions (16) can be caused to travel, and a high mobility is attained.

On the other hand, as to transistor operations, the device of FIG. 1 essentially operates in the depletion type (hereinbelow, abbreviated to "D-type") being normally-on because the carriers are supplied from the donor impurities so that the source and drain of the device are normally connected electronically. In contrast, the device of FIG. 2 essentially operates as the enhancement type (hereinbelow, abbreviated to "E-type") being normally-off for the reason that, only when a positive voltage is applied to the gate (13) of the device, the carriers are induced in a channel to connect the source and drain of the device, whereas when no voltage is applied to the gate (13), the source and drain are not connected. Accordingly, contrivances have been necessary in case of forming both the E-type and the D-type on an identical substrate for the purpose of integration. (In the ensuing description, GaAlAs will be exemplified as a semiconductor of great forbidden band width, and GaAs as a semiconductor of small forbidden band width. The invention, however, is similarly applicable to other combinations of materials adapted to form heterojunctions, for example, $Al_yGa_{1-y}As$-$Al_xGa_{1-x}As$, GaAs-AlGaAsP, InP-InGaAsP, InP-InGaAs, InAsGnAsSb, and InGaAs-InAlAs.)

More specifically, in the case of the device in FIG. 1, The GaAlAs layer (12) doped in the n-type is rendered thin to realize the E-type. The reason why the E-type is formed is as follows. When the GaAlAs layer (12) is thin, only the carriers within the GaAlAs layer (12) are insufficient for forming a Schottky contact, and also the carriers within the GaAs layer (11) are used. As a result, the carriers (15) are extinguished within the triangular potential, and only when a positive voltage greater than a threshold voltage is applied to the gate of the device, carriers are induced, so that the E-type device is formed. Herein, in a case where the doping concentration of the GaAlAs layer is $2 \times 10^{18}$ cm$^{-3}$ by way of example, the device becomes the D-type with a thickness of 0.07 μm and the E-type with a thickness of 0.06 μm. Accordingly, a precise etching technique for the GaAlAs layer (12) has been required for separately forming the E-type or the D-type by the use of the device in FIG. 1. This has caused the difficulties that labor is expended and that the etching must be accurately performed in the thickness direction of the layer.

In the case of the device in FIG. 2, the donor impurities are introduced into the non-doped GaAlAs layer (12), and the carriers are induced in the channel directly under the gate, whereby the E-type can be changed to the D-type. Here, the processes of diffusion, ion implantation etc. are used for introducing the impurities to serve as donors into the GaAlAs layer (12). In any case, however, the distribution of the impurities in the thickness direction of the layer assumes a skirt trailing shape, which has incurred the disadvantage that the donor impurities spread, not only within the GaAlAs layer (12), but also into the GaAs layer (11), to lower the mobility of the carriers.

Also with the semiconductor device of the inverse structure in which the positions of the GaAs layer (11) and the GaAlAs layer (12) in FIG. 1 or FIG. 2 are replaced with each other, the separate formation of the E-type or the D-type is equally or more difficult. Originally, once the inverse structure of FIG. 1 has been formed, the GaAlAs layer (12) cannot be thinned.

As thus far described, when it is intended to fabricate an integrated circuit by simply forming the individual semiconductor devices shown in FIG. 1 or FIG. 2 or having the inverse structure and thereafter forming the E-type and the D-type separately, the difficulties have been involved disadvantageously.

SUMMARY OF THE INVENTION

An object of the present invention is to solve the problems as stated above, and to provide a semiconductor member with which semiconductor elements of both the enhancement type and the depletion type can be separately formed on an identical substrate with ease and at a favorable available percentage of production, as well as a semiconductor device which employs the member.

In order to accomplish the above object, the present invention is so constructed that semiconductor layers are formed on a substrate beforehand so as to permit elements of both the E-type and the D-type to be formed, and that they are connected as may be needed, whereby the semiconductor elements of the E-type and the D-type are separately formed.

More specifically, a semiconductor member is constructed by stacking on a substrate at least the three layers of a first semiconductor layer which is undoped, a second semiconductor layer which has a forbidden band width greater than that of said first semiconductor layer and which is doped with impurities, said second semiconductor layer being formed on a side of said first semiconductor layer close to said substrate, and a third semiconductor layer which has a forbidden band width greater than that of said first semiconductor layer and which is undoped, said third semiconductor layer being formed on a side of said first semiconductor layer remote from said substrate. A semiconductor device is formed in such a way that at least one control electrode which controls currents to flow on first semiconductor layer sides of interfaces between said first semiconductor layer and said second and third semiconductor layers is disposed on a side of said second or third semiconductor layer remote from said first semiconductor layer, and that at least one pair of ohmic electrodes which are electrode regions extending from said third semiconductor layer to said interface between said first semiconductor layer and said second or third semiconductor layer are disposed on both sides of said control electrode.

The expression "undoped" signifies that no impurity is intentionally introduced, and it indicates a state in which the impurity concentration is not higher than approximately $1-3\times10^{15}$ cm$^{-3}$.

DETAILED DESCRIPTION OF THE PREFERRED EMBODIMENTS

Figure 1:
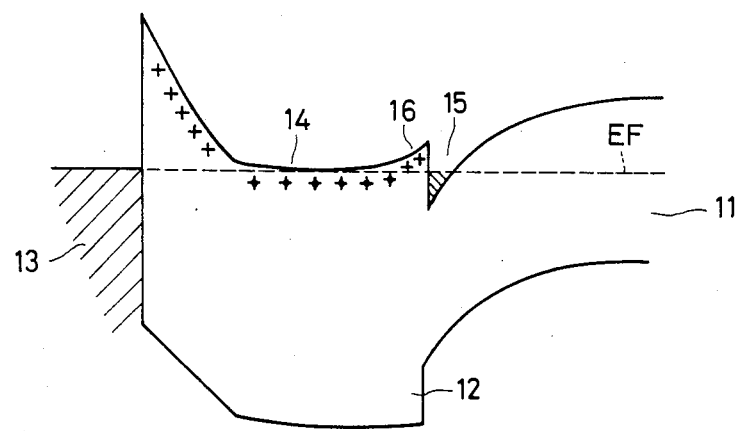
FIGS. 1 and 2 are diagrams of the energy band structures of prior-art semiconductor devices.
Figure 2:
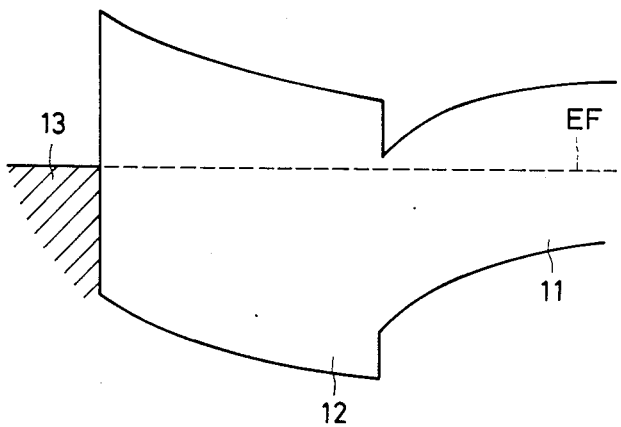
Figure 3:
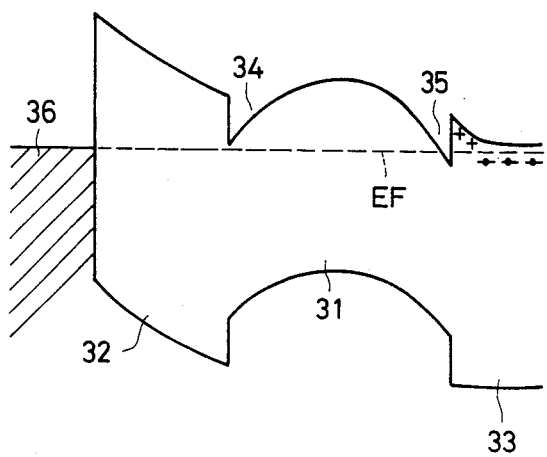
FIG. 3 is a diagram of the energy band structure of a semiconductor device according to the present invention.

FIG. 3 shows a diagram of the energy band structure of the present invention. According to this structure, a high purity GaAs layer (31) (the thickness of which is selected to be approximately 0.3-1.0 μm) is held between a high purity GaAlAs layer (32) and a GaAlAs layer doped in the n-type (33) which are greater in the forbidden band width than the layer (31) (the thickness of each GaAlAs layer being selected to be approximately 0.05-0.1 μm), and channels are formed on both the sides of the high purity GaAs layer. Here, the Al contents of the GaAlAs layers (32) and (33) on both the sides need not always be equal. The channel (34) constitutes an E-type device, such as the device of FIG. 2, in which carriers are induced when a positive voltage is applied to a gate electrode (36). The channel (35) forms a D-type channel because carriers are supplied from the doped GaAlAs layer (33) even when no gate voltage is applied. Accordingly, the elements of both the types may be properly used at need.

In the case of FIG. 3, the carriers to be induced in the two channels are controlled by the identical gate. It is also possible, however, that gate electrodes (36) and (37) are disposed on both sides as shown in FIG. 4, thereby to individually control the carriers of the respective channels.

In each of these constructions, it is of course possible to separately take out and use the respective elements of the E- and D-types. Since, however, the elements on both the sides can be used in parallel connection by providing the common electrode, the density of integration of the elements is enhanced. Especially with the structure of FIG. 4, the density of integration is more enhanced because the carriers of both the channels can be controlled individually.

Figure 4:
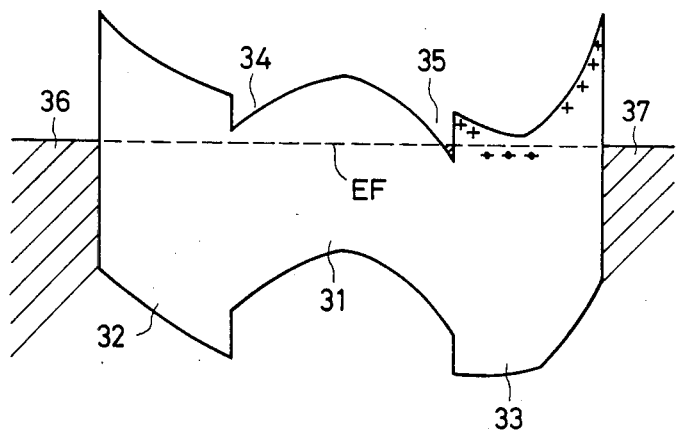
FIG. 4 is a diagram of the energy band structure of the present invention in the case where control electrodes are provided on both sides.

Although only the effects of the fundamental structures in FIGS. 3 and 4 have thus far been described, similar effects are attained even with each of the following structures:

(1) A structure wherein, in order to enhance the qualities of the respective semiconductor layers, a high purity GaAs layer (approximately 0.1 μm thick) or/and a high purity GaAlAs layer (approximately 0.1 μm thick) is/are grown on a substrate, whereupon the plurality of semiconductor layers as shown in FIG. 3 or FIG. 4 are grown.

(2) A structure wherein a GaAs layer which is approximately 0.01-0.1 μm thick is disposed on the GaAlAs layer (32) in order to prevent the oxidation of the GaAlAs layer at a front surface.

(3) A structure wherein a GaAlAs layer of high purity (approximately 6 nm-20 nm thick) is interposed between the high purity GaAs layer (31) and the n-type GaAlAs layer (33) in order that the distances between the carriers to travel through the channel (35) and donor atoms within the GaAlAs layer (33) doped in the n-type may be more lengthened to raise the mobilities of the carriers.

(4) A structure which includes any combination of the structures (1)-(3) or all the structures (1)-(3).

- As stated above, when the construction as shown in FIG. 3 or FIG. 4 is employed, the elements of both the E- and D-types can be fabricated and used on the identical substrate without requiring the precise control of etching.

Now, methods of producing semiconductor devices according to the present invention will be described in detail.

EXAMPLE 1

Figure 5A:
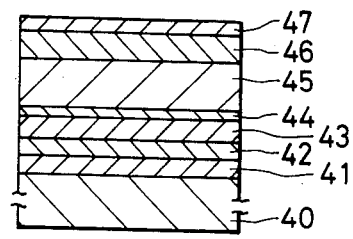
FIGS. 5a and 5b are sectional views showing steps for fabricating an IC according to the present invention.
Figure 5B:
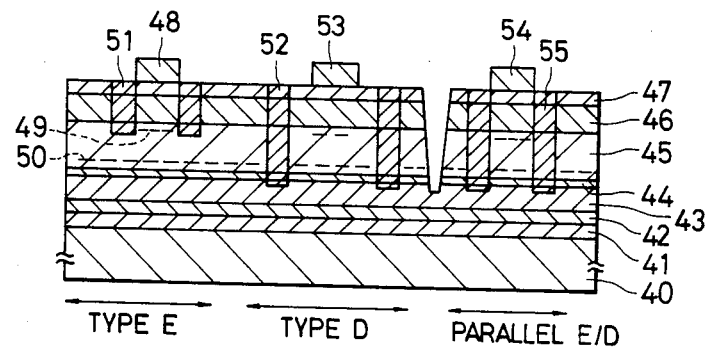

FIGS. 5a and 5b show steps for fabricating an IC according to the present invention. Since, in the present invention, abruptness is required of the interface as in the prior-art examples, the crystal growth was performed by the molecular beam epitaxy (hereinbelow, denoted by "MBE process").

First, as illustrated in FIG. 5a, respective layers were grown on a semi-insulating GaAs substrate (40) by the use of the MBE process. Regarding the thicknesses of the respective layers viewed from the substrate side in succession, the high purity GaAs layer (41) was 0.1 μm thick, the high purity GaAlAs layer (42) 0.1 μm, the n-type GaAlAs layer (doped with Si, doping concentration $n=2\times10^{18}$ cm$^{-3}$) (43) 70 nm, the high purity GaAlAs layer (44) 6 nm, the high purity GaAs layer (45) 0.5 μm, the high purity GaAlAs layer (46) 60 nm, and the n-type GaAs layer (doped with Si, doping concentration $n=2\times10^{18}$ cm$^{-3}$) (47) 20 nm. Here, the high purity GaAs layer (41) and the high purity GaAlAs layers (42) which are close to the substrate are buffer layers for enhancing the qualities of crystals, the high purity GaAlAs layer (44) is a spacer layer, and the n-type GaAs layer (47) is a layer for preventing the oxidation of the GaAlAs layer (46).

In a channel which is formed on the upper side of the high purity GaAs layer (45), no carrier is induced without applying a positive voltage to a gate because the adjoining GaAlAs layer (46) is non-doped. Accordingly, the channel formed on the upper side of the high purity GaAs layer (45) functions as the E-type. On the other hand, a channel on the lower side does not always become a D-type channel as described before, depending upon the thickness and doping concentration of the adjoining GaAlAs layer (43). Therefore, the thickness, doping concentration etc. of the AlGaAs layer (43) need to be designed in advance so that carriers may be supplied from the doped GaAlAs layer (43) without applying any voltage to the gate. Thus, the channel on the lower side is allowed to function as the D-type.

Next, mesa etching was peformed in a required place to isolate elements. In the case of FIG. 5b, the mesa etching was carried out between the D-type element and the E/D-parallel type elements. It is to be noted, however, that the mesa etching is not always necessary. Subsequently, a dummy gate (48) of SiO$_2$ was formed, whereupon using the dummy gate as a mask, Si was ion-implanted (51) as illustrated in FIG. 5b. On this occasion, the necessary place of the E-type element is ion-implanted with donor atoms shallowly lest they should reach the lower channel when ohmic electrodes for source and drain electrodes are formed. It is only in a part directly under the gate that the carriers are induced upon the application of the gate voltage, so this ion implantation needs to be executed in self-alignment fashion. Meantime, when only the element of the D-type is necessary, SiO$_2$ larger than the place of the E-type may be ion-implanted (52) as a dummy gate deeply enough to reach the lower channel. When a gate electrode (53) equal in size to the gate electrode (48) of the E-type is formed at a later step, a gap appears between the gate electrode (53) and the ion-implanted part (52), and only the element of the D-type can be taken out. That is, since the channel on the upper side of the high purity GaAs layer (45) has the carriers induced in only the part underneath the gate (53), no current flows and no element is formed. In addition, when ion implantation (55) is performed deeply in self-alignment fashion so as to form no gap between the ion-implanted part and a gate electrode portion (54), the upper and lower elements of both the E- and D-types can be used in parallel connection. Accordingly, the ion implantation operations are performed several times as may be needed. In FIG. 5b, (49) indicates the channel of the E-type, and (50) the channel of the D-type.

With the prior-art structures, it has been necessary to form the respective elements of the E- and D-types individually beforehand and to thereafter connect them by wiring. In contrast, the present invention dispenses with the necessity.

After the ion implantation operations required for the respective elements were performed as described above, annealing was conducted to activate the implanted atoms. On this occasion, in order to prevent the sag of the hetero-interface, the diffusion of the implanted atoms, etc. to the utmost, the annealing was flash annealing at 750° C.

Subsequently, the ohmic electrodes were formed on source and drain portions by the use of Au/Ge/Ni, and the gate electrodes were by the use of Ti/Pt/Au, whereupon the respective elements were wired by the use of Al.

As described above, in fabricating the elements, any precise etching technique is not required, and the ion implantation is not performed in the channel parts directly under the gates. It was therefore possible to properly and separately form the elements of both the E- and D-types not inferior in performance to the prior arts more easily than with the prior arts. Moreover, the density of integration was made higher than in the prior arts by vertically connecting both the channels in parallel.

EXAMPLE 2

Figure 6:
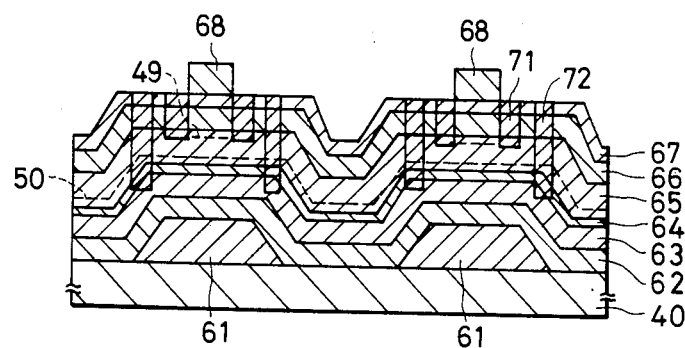
FIG. 6 is a sectional view showing an embodiment of the present invention.

FIG. 6 shows a diagram of a sectional structure in the case where gate electrodes are disposed on both the sides of semiconductor layers.

Gate electrodes on a substrate side were formed in such a way that an n+ GaAs layer (61) doped with Sn at $2 \times 10^{19}$ cm$^{-3}$ was grown on a semi-insulating GaAs substrate (40) to a thickness of 0.3 μm by the MBE process, and that it was thereafter patterned.

After the patterning, respective layers were grown by the MBE process again in the order mentioned: (1) a high purity GaAlAs layer (62) 0.05 μm thick to be used as a barrier layer, (2) an Si-doped GaAlAs layer (63) 0.07 μm thick, (3) a high purity GaAlAs layer (64) 6 nm thick, (4) a high purity GaAs layer (65) 0.5 μm thick, (5) a high purity GaAlAs layer (66) 0.07 μm thick, and (6) a GaAs layer (67) 0.02 μm thick for preventing oxidation.

Next, gate electrodes (68) on an upper side were formed by the use of tungsten silicide, and using them as a mask, Si was ion-implanted (parts (71)) shallowly so as to connect only an upper channel thereto. Next, a mask was formed of SiO$_2$ so as to completely conceal the above implanted parts, and ion implantation (parts (72)) was performed deeply so as to reach a lower channel.

At the next step, annealing was performed at 750° C. so as to prevent the hetero-interface from sagging, whereby the ion-implanted atoms were activated. Thereafter, ohmic electrodes for source and drain electrodes were formed by the use of Au/Ge/Ni.

In this way, elements of both the E- and D-types can be formed in the identical place and can be controlled individually, so that the density of integration becomes higher than in the prior arts. Further, any precise etching technique is not required for properly and separately forming the E- and D-types.

While the hetero-interface between GaAs and GaAlAs was employed in the above examples 1 and 2, other materials adapted to form heterojunctions can of course attain similar effects. By way of example, the materials are the compound semiconductor systems of Ga$_{1-x}$Al$_x$As-Ga$_{1-y}$Al$_y$As, GaAs-GaAlAsP, InP-InGaAsP, InP-InGaAs, InAs-GaAsSb, and InGaAs-InAlAs.

According to the present invention described above, the following effects are brought forth:

(1) In properly and separately forming both the E- and D-types, any precise etching technique is not required.

(2) Since ion implantation is not performed in a heterointerface directly under a gate, the performance of an element is not degraded by the ion implantation.

(3) Also in the IC implementation, the density of integration is enhanced because two, upper and lower elements can be used in an identical place.

We claim:

1. A semiconductor device comprising a first semiconductor layer which is undoped, a second semiconductor layer which has a forbidden band width greater than that of said first semiconductor layer and which is doped with impurities, said second semiconductor layer being formed on a side of said first semiconductor layer close to said substrate, a third semiconductor layer which has a forbidden band width greater than that of said first semiconductor layer and which is undoped, said third semiconductor layer being formed on a side of said first semiconductor layer remote from said substrate, at least one control electrode which controls currents to flow on first semiconductor layer sides of interfaces between said first semiconductor layer and said second and third semiconductor layers and which is formed on a side of said second or third semiconductor layer remote from said first semiconductor layer, and at least one pair of ohmic electrodes which are electrode regions extending from said third semiconductor layer to said interface between said first semiconductor layer and said second or third semiconductor and which are formed on both sides of said control electrode, wherein carriers can be induced in said first semiconductor layer along a first interface between said first semiconductor layer and said second semiconductor layer without applying a voltage to said at least one control electrode, while carriers cannot be induced in said first semiconductor layer along a second interface between said first semiconductor layer and said third semiconductor layer without applying a voltage to said at least one control electrode.

2. A semiconductor device according to claim 1, comprising at least one undoped semiconductor layer which is interposed between said second semiconductor layer and said substrate.

3. A semiconductor device according to claim 2, wherein said undoped semiconductor layer between said second semiconductor layer and said substrate is made of the same material as that of said substrate or said second semiconductor layer.

4. A semiconductor device according to claim 2, comprising a semiconductor layer of the same material as that of said substrate and a semiconductor layer of the same material as that of said second semiconductor layer which are interposed between said substrate and said second semiconductor layer successively from the substrate side.

5. A semiconductor device according to any of claims 1 to 4, comprising an oxidation-proof semiconductor layer which is formed on said third semiconductor layer.

6. A semiconductor device according to any of claims 1 to 4, comprising a semiconductor layer which is made of the same material as that of said second semiconductor layer but which is undoped, and which is interposed between said first semiconductor layer and said second semiconductor layer.

7. A semiconductor device according to any of claims 1 to 4, comprising said pair of ohmic electrodes which have electrode regions extending from said third semiconductor layer to said interface between said first semiconductor layer and said second semiconductor layer, and said pair of ohmic electrodes which have electrode regions extending from said third semiconductor layer to said interface between said first semiconductor layer and said third semiconductor layer.

8. A semiconductor device comprising a semiconductor substrate; a plurality of semiconductor layers which are formed on said semiconductor substrate and which comprise a first semiconductor layer having a small forbidden band width, and second and third semiconductor layers having large forbidden band widths and each formed respectively on opposing sides of said first semiconductor layer, said second semiconductor layer being disposed on a side of said first semiconductor layer closest to the semiconductor substrate, said second semiconductor layer being doped with impurities, and said third semiconductor layer being undoped; a first control electrode which controls the electric current flowing in said first semiconductor layer along a first interface between said first semiconductor layer and said second semiconductor layer; a first pair of ohmic electrodes formed on both sides of said first control electrode and having electrode regions connected to said first interface; a second control electrode which controls the electric current flowing in said first semiconductor layer along a second interface between said first semiconductor layer and said third semiconductor layer; and a second pair of ohmic electrodes formed on both sides of said second control electrode and having electrode regions connected to said second interface.

9. A semiconductor device according to claim 8, wherein said first control electrode is disposed on said third semiconductor layer, and said second control electrode is disposed on said third semiconductor layer.

10. A semiconductor device according to claim 8, wherein said first control electrode is disposed between said substrate and said second semiconductor layer and said second control electrode is disposed on the third semiconductor layer.

11. A semiconductor device comprising a first semiconductor layer which is undoped; a second semiconductor layer which has a forbidden band width greater than that of said first semiconductor layer and which is doped with impurities, said second semiconductor layer being formed on a side of said first semiconductor layer close to said substrate; a third semiconductor layer which has a forbidden band width greater than that of said first semiconductor layer and which is undoped, said third semiconductor layer being formed on a side of said first semiconductor layer remote from said substrate; at least one control electrode which controls currents to flow on first semiconductor layer sides of interfaces between said first semiconductor layer and said second and third semiconductor layers and which is formed on a side of said second or third semiconductor layer remote from said first semiconductor layer, said at least one control electrode consisting of a control electrode which principally controls the current to flow on the first semiconductor layer side of said interface between said first semiconductor layer and said second semiconductor layer and which is disposed on the side of said second semiconductor layer remote from said first semiconductor layer, and a control electrode which principally controls the current to flow on the first semiconductor layer side of said interface between said first semiconductor layer and said third semiconductor layer and which is disposed on the side of said third semiconductor layer remote from said first semiconductor layer; and at least one pair of ohmic electrodes which are electrode regions extending from said third semiconductor layer to said interface between said first semiconductor layer and said second or third semicondcutor layer and which are formed on both sides of said control electrode.

* * * * *